(12) United States Patent
Takatsuji

(10) Patent No.: US 10,141,103 B2
(45) Date of Patent: Nov. 27, 2018

(54) POWER SUPPLY CIRCUIT

(71) Applicant: MURATA MANUFACTURING CO., LTD., Kyoto-fu (JP)

(72) Inventor: Hiroyuki Takatsuji, Nagaokakyo (JP)

(73) Assignee: Murata Manufacturing Co., Ltd., Kyoto-fu (JP)

(\*) Notice: Subject to any disclaimer, the term of this patent is extended or adjusted under 35 U.S.C. 154(b) by 0 days.

(21) Appl. No.: 15/600,835

(22) Filed: May 22, 2017

(65) Prior Publication Data

US 2017/0256356 A1 Sep. 7, 2017

Related U.S. Application Data

(63) Continuation of application No. PCT/JP2016/066896, filed on Jun. 7, 2016.

(30) Foreign Application Priority Data

Jun. 29, 2015 (JP) .................................. 2015-129760

(51) Int. Cl.
*H01F 27/42* (2006.01)
*H02M 3/00* (2006.01)
(Continued)

(52) U.S. Cl.
CPC .............. *H01F 27/42* (2013.01); *H01F 17/04* (2013.01); *H01F 27/06* (2013.01); *H01F 27/292* (2013.01);
(Continued)

(58) Field of Classification Search
CPC ............ H02M 3/00; H02M 3/02; H02M 3/10; H02M 3/145; H02M 3/155; H02M 3/156; H02M 3/158; H02M 3/1584; H02M 3/1588; H02M 2001/0064; H02M 2001/123; H02M 2001/342; H02M 2001/344; H02M 2001/346; H02M 2001/348; H02M 1/12;
(Continued)

(56) References Cited

U.S. PATENT DOCUMENTS

2014/0285176 A1\* 9/2014 Takahashi ............... H02M 1/14
323/364
2017/0236622 A1\* 8/2017 Yoshino ............. H01B 11/1895
174/107

FOREIGN PATENT DOCUMENTS

JP S61-174713 U 10/1986
JP H03-227506 A 10/1991
(Continued)

OTHER PUBLICATIONS

English translation of JP H07240319.\*
(Continued)

*Primary Examiner* — Timothy J Dole
*Assistant Examiner* — Carlos Rivera-Perez
(74) *Attorney, Agent, or Firm* — Studebaker & Brackett PC

(57) ABSTRACT

A power supply circuit includes a DC-DC converter and a choke coil. The choke coil includes a pair of coils wound in mutually opposite directions, and the coils are connected between a DC power source and the DC-DC converter. In the choke coil, a self-resonating frequency in a common mode is higher than a self-resonating frequency in a normal mode. In the choke coil, a normal mode impedance at the highest frequency in an AM band is higher than a common mode impedance at the lowest frequency in an FM band.

4 Claims, 7 Drawing Sheets

(51) Int. Cl.
  *H03H 7/09* (2006.01)
  *H01F 27/06* (2006.01)
  *H01F 17/04* (2006.01)
  *H01F 27/29* (2006.01)
  *H01F 27/40* (2006.01)
  *H02M 1/44* (2007.01)
  *H02M 3/156* (2006.01)
  *H01F 17/00* (2006.01)

(52) U.S. Cl.
  CPC .............. *H01F 27/40* (2013.01); *H02M 1/44* (2013.01); *H02M 3/00* (2013.01); *H02M 3/156* (2013.01); *H03H 7/09* (2013.01); *H01F 2017/0093* (2013.01); *H01F 2027/065* (2013.01); *Y02B 70/1425* (2013.01)

(58) Field of Classification Search
  CPC .......... H02M 1/14; H02M 1/143; H02M 1/15; H02M 1/34; H02M 1/44; H02M 1/126; H02M 7/003; H02M 7/44; H02M 7/5387; H02M 2003/1552; H02M 2003/1566; H01F 27/006; H01F 27/004; H01F 27/24; H01F 27/33; H01F 27/34; H01F 27/42; H01F 2017/0093; H01F 2027/065; H01F 27/06; H01F 27/04; H01F 27/292; H01F 27/40; H01F 17/04; H03H 7/06; H03H 7/09; Y02B 70/1425
  USPC .................. 363/15–21.18, 44–48, 50, 56.12, 363/123–127, 170–173; 323/205–211, 323/222–226, 266, 271–276, 282–287, 323/351; 336/192, 220, 221; 315/85
  See application file for complete search history.

(56) References Cited

FOREIGN PATENT DOCUMENTS

| | | |
|---|---|---|
| JP | H07-240319 A | 9/1995 |
| JP | 2008-034777 A | 2/2008 |
| JP | 2010-119085 A | 5/2010 |
| JP | 2013-062477 A | 4/2013 |

OTHER PUBLICATIONS

International Search Report issued in PCT/JP2016/066896; dated Sep. 6, 2016.
Written Opinion issued in PCT/JP2016/066896; dated Sep. 6, 2016.

* cited by examiner

POWER SUPPLY CIRCUIT

CROSS REFERENCE TO RELATED APPLICATIONS

This application claims benefit of priority to Japanese Patent Application 2015-129760 filed Jun. 29, 2015, and to International Patent Application No. PCT/JP2016/066896 filed Jun. 7, 2016, the entire content of which is incorporated herein by reference.

TECHNICAL FIELD

The present disclosure relates to a power supply circuit that reduces noise using a choke coil.

BACKGROUND

Noise filters including common mode choke coils are generally known (see Japanese Unexamined Patent Application Publication No. 2010-119085, for example). In the noise filter disclosed in Japanese Unexamined Patent Application Publication No. 2010-119085, a plurality of coil electrode layers and a plurality of capacitor electrode layers are provided in or on upper surfaces of a plurality of dielectric layers. First and second coils are formed by the respective coil electrode layers, and a capacitor is formed by the capacitor electrode layers.

SUMMARY

With the noise filter disclosed in Japanese Unexamined Patent Application Publication No. 2010-119085, a common mode choke coil and an LC filter are formed by the first and second coils and the capacitor, and both normal mode noise (differential mode noise) and common mode noise are reduced. The noise filter disclosed in Japanese Unexamined Patent Application Publication No. 2010-119085 achieves a particularly high normal mode noise reduction effect by reducing a coupling coefficient of the common mode choke coil.

The noise filter disclosed in Japanese Unexamined Patent Application Publication No. 2010-119085 uses a common mode choke coil, and thus the common mode impedance rises in a low-frequency band. In other words, in the case where common mode signals propagate through the first and second coils in the same direction, positive mutual inductance M (mutual induction) arises in the common mode choke coil. Thus common mode inductance in the first coil becomes the sum of self-inductance L of the first coil and the mutual inductance M of the first and second coils (L+M). On the other hand, in the case where normal mode signals propagate through the first and second coils in mutually opposite directions, negative mutual inductance M arises in the common mode choke coil. Thus normal mode inductance in the first coil becomes the difference between the self-inductance L of the first coil and the mutual inductance M of the first and second coils (L−M). As such, the common mode impedance is higher than the normal mode impedance in the low-frequency band, where there is no magnetic saturation.

In a power supply circuit having a DC-DC converter, normal mode noise is often a problem in a low-frequency band, whereas common mode noise is often a problem in a high-frequency band. Particularly in devices installed in vehicles, normal mode noise is a problem in an AM band and common mode noise is a problem in an FM band.

In this case, according to the noise filter disclosed in Japanese Unexamined Patent Application Publication No. 2010-119085, the common mode impedance will be higher than the normal mode impedance in the low-frequency band even if the coupling coefficient of the first and second coils is reduced. Thus the noise filter disclosed in Japanese Unexamined Patent Application Publication No. 2010-119085 has a problem in that it is difficult to sufficiently reduce noise in a power supply circuit having a DC-DC converter.

Having been achieved in light of the above-described problem, it is an object of the present disclosure to provide a power supply circuit that suppresses normal mode noise in a low-frequency band and suppresses common mode noise in a high-frequency band.

(1) To solve the above-described problems, a power supply circuit according to the present disclosure includes: a DC-DC converter, having a switching element that switches a DC input voltage inputted from a DC power source, that supplies a DC output voltage according to an on-off duty ratio of the switching element to a load; and a choke coil, having a pair of coils wound in mutually opposite directions, in which the paired coils are connected between the DC power source and the DC-DC converter. In the choke coil, a self-resonating frequency in a common mode, in which a current flows in the pair of coils in the same direction, is higher than a self-resonating frequency in a normal mode, in which the current flows in the pair of coils in mutually opposite directions. In the choke coil, a normal mode impedance at the highest frequency in a predetermined low-frequency band is higher than a common mode impedance at the lowest frequency in a high-frequency band that is higher than the low-frequency band.

According to the present disclosure, the power supply circuit includes the choke coil, which has the pair of coils wound in mutually opposite directions, with the pair of coils connected between the DC power source and the DC-DC converter. In this case, the paired coils are wound in mutually opposite directions, and thus the normal mode impedance becomes higher than the common mode impedance in the low-frequency band. In other words, in the case where a common mode signal propagates in the pair of coils in the same direction, a negative mutual inductance M arises in the choke coil, and common mode inductance in the paired coils becomes a difference between self-inductance L and the mutual inductance M (L−M). On the other hand, in the case where a normal mode signal propagates in the pair of coils in mutually opposite directions, a positive mutual inductance M arises in the choke coil, and normal mode inductance in the paired coils becomes a sum of the self-inductance L and the mutual inductance M (L+M). As such, the normal mode impedance can be made higher than the common mode impedance in the low-frequency band, where there is no magnetic saturation. As a result, the power supply circuit can reduce normal mode noise in the low-frequency band.

Additionally, the choke coil is configured such that the self-resonating frequency in the common mode is higher than the self-resonating frequency in the normal mode, and the normal mode impedance at the highest frequency in the low-frequency band is higher than the common mode impedance at the lowest frequency in the high-frequency band. Thus the difference between the normal mode impedance and the common mode impedance in the low-frequency band can be increased. As a result, the power supply circuit can increase the effect of reducing normal mode noise in the low-frequency band.

(2) In the power supply circuit according to the present disclosure, the self-resonating frequency in the common mode is preferably present within the high-frequency band.

According to this configuration, the common mode impedance increases near the self-resonating frequency in the common mode. Thus the common mode impedance can be increased in the high-frequency band, and common mode noise arising in the high-frequency band can be reduced.

(3) In the power supply circuit according to the present disclosure, the high-frequency band is preferably an FM band and the low-frequency band is preferably an AM band.

According to this configuration, when the power supply circuit according to the present disclosure is used in a vehicle-installed device, for example, normal mode noise in the AM band and common mode noise in the FM band can be reduced. As a result, normal mode noise in the AM band and common mode noise in the FM band, which is a problem in vehicle-installed devices, can be suppressed using a single choke coil.

(4) In the power supply circuit according to the present disclosure, the switching element of the DC-DC converter is preferably driven at a switching frequency that is lower than the low-frequency band.

According to this configuration, when the DC-DC converter is driven, a normal mode current at the switching frequency flows in the pair of coils. At this time, the normal mode impedance at the switching frequency is lower than the normal mode impedance in the low-frequency band. Thus when the DC-DC converter is driven, normal mode noise in the low-frequency band can be dampened while suppressing dampening of normal mode current at the switching frequency.

DETAILED DESCRIPTION

A power supply circuit embodying the present disclosure will be described in detail hereinafter with reference to the accompanying drawings.

Figure 1:
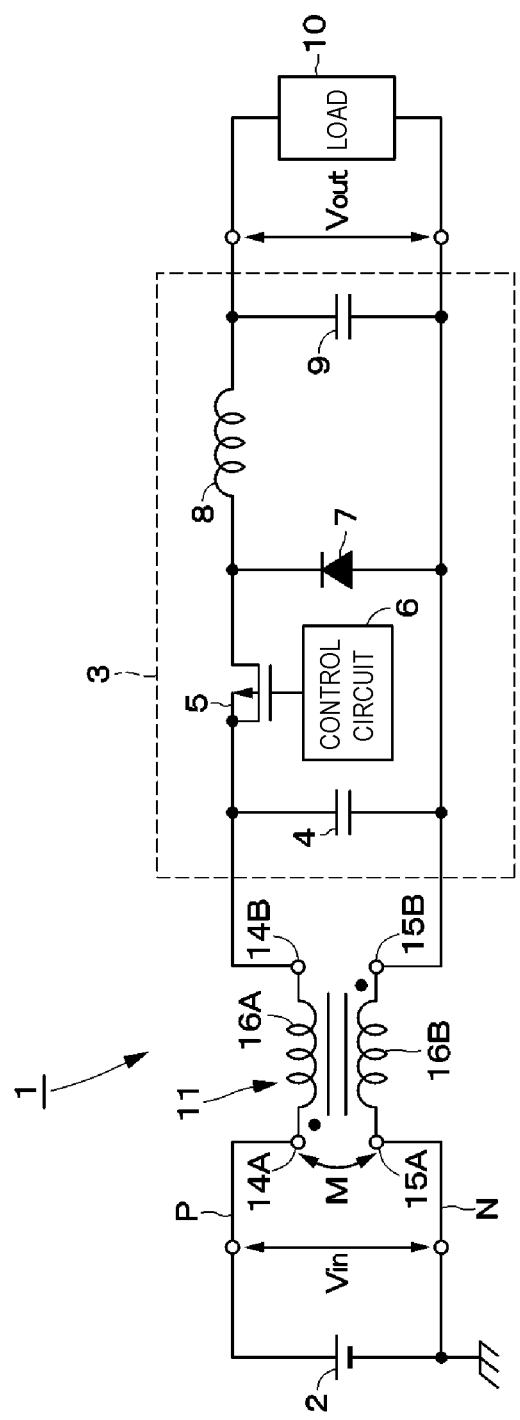
FIG. 1 is a circuit diagram illustrating the overall configuration of a power supply circuit according to a first embodiment.

FIG. 1 illustrates a power supply circuit 1 according to a first embodiment. The power supply circuit 1 is constituted of a DC-DC converter 3 and a choke coil 11. The power supply circuit 1 uses the DC-DC converter 3 to step down a DC input voltage Vin inputted from a DC power source 2 to a DC output voltage Vout, and supplies the DC output voltage Vout to a load 10. The power supply circuit 1 reduces noise arising between the DC power source 2 and the load 10 using the choke coil 11.

The DC power source 2 supplies the DC input voltage Vin. One end of the DC power source 2 is connected to a positive-side power source line P, and is connected to a coil 16A of the choke coil 11. Another end of the DC power source 2 is connected to a negative-side power source line N, and is grounded as well as being connected to a coil 16B of the choke coil 11.

The DC-DC converter 3 is provided between the DC power source 2 and the load 10. The DC-DC converter 3 includes an input-side capacitor 4, a transistor 5, a control circuit 6, a diode 7, a coil 8, an output-side capacitor 9, and the like, and constitutes a noninsulated-type DC-DC converter. The DC-DC converter 3 steps down the DC input voltage Vin inputted from the DC power source 2 to the DC output voltage Vout in accordance with a duty ratio of the transistor 5.

One end of the input-side capacitor 4 is connected to the positive-side power source line P. Another end of the input-side capacitor 4 is connected to the negative-side power source line N. The input-side capacitor 4 is therefore connected to the DC power source 2 in parallel.

The transistor 5 constitutes a switching element that switches the DC input voltage Vin. The transistor 5 is configured using, for example, a p-channel field-effect transistor (a p-type MOSFET) connected to the positive-side power source line P. The source of the transistor 5 is connected to the coil 16A of the choke coil 11, and the drain of the transistor 5 is connected to one end of the coil 8. The gate of the transistor 5 is connected to the control circuit 6. As such, in response to a control signal from the control circuit 6, the transistor 5 is switched between an on state, which allows the supply of current from the DC power source 2, and an off state, which stops the supply of current from the DC power source 2. At this time, the transistor 5 repeats the switching operations at a predetermined switching frequency Fs in accordance with the control signal from the control circuit 6.

In this case, the switching frequency Fs of the transistor 5 is preferably set to a lower frequency than, for example, an AM band (from 300 kHz to 3 MHz) in order to suppress a situation in which the choke coil 11 affects the driving current of the DC-DC converter 3. In other words, the switching frequency Fs is preferably lower than the lowest frequency of a low-frequency band (an AM band) (that is, Fs<300 kHz). On the lower-frequency side than the AM band, a normal mode impedance Zn of the choke coil 11 increases as the frequency rises. In light of this, the switching frequency Fs of the transistor 5 is preferably as low a frequency as possible compared to the AM band, within an allowable range (Fs=approximately 100 kHz, for example).

The cathode of the diode 7 is connected to one end of the coil 8 through the positive-side power source line P, and the anode of the diode 7 is grounded through the negative-side power source line N. The diode 7 constitutes a free-wheeling diode that discharges energy stored in the coil 8. Another end of the coil 8 is connected to the load 10, and supplies the DC output voltage Vout to the load 10. One end of the output-side capacitor 9 is connected to the positive-side power source line P, and another end of the output-side capacitor 9 is connected to the negative-side power source line N. The output-side capacitor 9 constitutes a smoothing capacitor.

The choke coil 11 is provided so as to be located between the DC power source 2 and the DC-DC converter 3. The choke coil 11 is constituted of a wound-type coil in which the paired coils 16A and 16B are wound around a core 12. As indicated by the specific example illustrated in FIGS. 2 and 3, the choke coil 11 includes the core 12, leg portions 13A and 13B, electrodes 14A, 14B, 15A, and 15B, a pair of the coils 16A and 16B, and a ferrite plate 17. The choke coil 11 reduces normal mode noise and common mode noise flowing in the power supply circuit 1.

Figure 2:
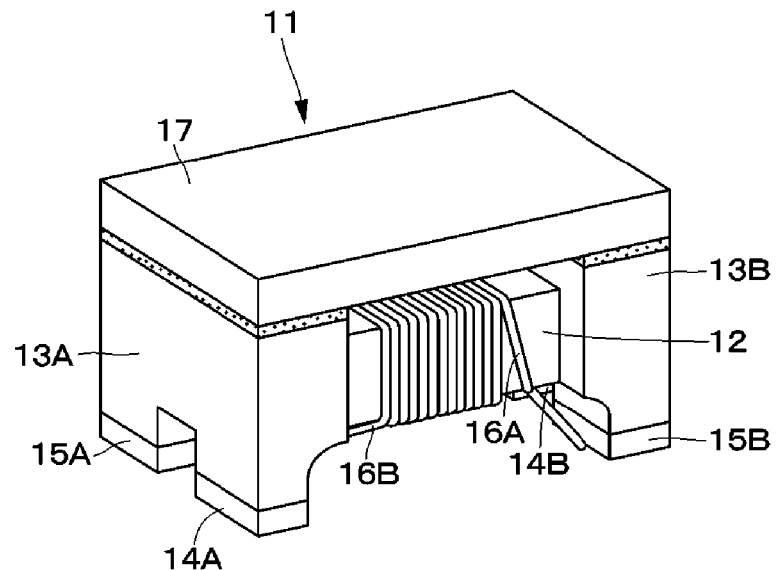
FIG. 2 is a perspective view of a choke coil indicated in FIG. 1.
Figure 3:
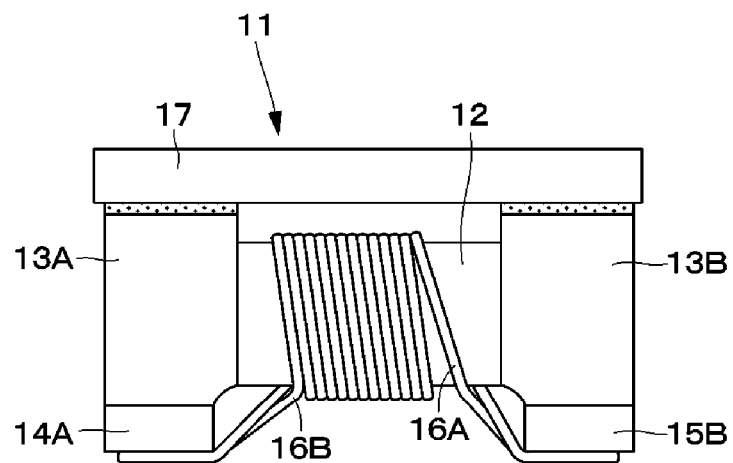
FIG. 3 is a front view of the choke coil indicated in FIG. 1.

As illustrated in FIGS. 2 and 3, the core 12 has a substantially quadrangular column shape, and is positioned between the two leg portions 13A and 13B. The core 12 is formed from a magnetic material such as ferrite, for example, and the paired coils 16A and 16B are wound thereon.

The leg portions 13A and 13B are positioned on respective ends of the core 12, and base end sides thereof (sides thereof located toward the electrodes 14A, 14B, 15A, and 15B) are formed having forked shapes. The electrodes 14A and 15A are provided on a bottom surface of the base end side of the leg portion 13A, and the electrodes 14B and 15B are provided on a bottom surface of the base end side of the leg portion 13B. In other words, the electrodes 14A and 14B are positioned on a diagonal line of the choke coil 11, and the electrodes 15A and 15B are positioned on a diagonal line intersecting with the diagonal line of the electrodes 14A and 14B.

The electrode 14A is connected to the DC power source 2 through the positive-side power source line P, and the electrode 14B is connected to the source of the transistor 5 through the positive-side power source line P. On the other hand, the electrodes 15A and 15B are connected to the negative-side power source line N.

The paired coils 16A and 16B are formed by wires, made from a conductive material covered with an insulating film, that are wound around the core 12 in mutually opposite directions in a helical or spiral shape. Specifically, the coil 16A is wound in a clockwise manner, for example, with one end of the coil 16A connected to the electrode 14A and another end of the coil 16A connected to the electrode 14B. On the other hand, the coil 16B is wound in a counter-clockwise manner, for example, with one end of the coil 16B connected to the electrode 15A and another end of the coil 16B connected to the electrode 15B. In other words, the coils 16A and 16B are connected between the DC power source 2 and the DC-DC converter 3, and are wound a predetermined number of times in accordance with the required impedance value.

The ferrite plate 17 is provided between the leg portions 13A and 13B so as to cover the coils 16A and 16B. The ferrite plate 17 is formed as a substantially rectangular plate using a magnetic material such as ferrite, with both ends thereof fixed by an adhesive to upper surfaces of the leg portions 13A and 13B, which are opposite from the base end-side bottom surfaces of the leg portions 13A and 13B.

Here, the choke coil 11 can adjust a coupling coefficient K by changing the relative permeability of the core 12 and the ferrite plate 17, the winding ratio of the coils 16A and 16B, and so on. As such, with the choke coil 11, the coupling coefficient K is adjusted such that the normal mode impedance Zn in the AM band and a common mode impedance Zc in the FM band (from 30 MHz to 300 MHz) take on desired values. Specifically, with the choke coil 11, the coupling coefficient K is adjusted such that a self-resonating frequency Fc in the common mode is greater than a self-resonating frequency Fn in the normal mode and a normal mode impedance Zna at the highest frequency in the AM band (3 MHz) is greater than a common mode impedance Zcf at the lowest frequency in the FM band (30 MHz) (that is, Zna>Zcf).

Increasing the frequency difference between the common mode self-resonating frequency Fc and the normal mode self-resonating frequency Fn makes it possible to increase the difference between the normal mode impedance Zn in the AM band and the common mode impedance Zc in the AM band. Thus the choke coil 11 is preferably set such that the self-resonating frequency Fc in the common mode is higher than the self-resonating frequency Fn in the normal mode by no less than a predetermined value (no less than 2×, for example). Additionally, the choke coil 11 is preferably set such that the self-resonating frequency Fc in the common mode is present within a predetermined high-frequency band such as the FM band.

The coupling coefficient K of the coils 16A and 16B serving as the winding is set to a value greater than 0 and less than 1 (0<K<1). Through this, with the choke coil 11, both the common mode impedance Zc and the normal mode impedance Zn are produced in accordance with mutual induction between the coils 16A and 16B. However, the common mode self-resonating frequency Fc and the normal mode self-resonating frequency Fn approach each other as the coupling coefficient K decreases. Thus a lower limit value of the coupling coefficient K is set to a range in which the common mode self-resonating frequency Fc is higher than the normal mode self-resonating frequency Fn. Additionally, when the normal mode impedance Zn is set to a value in a desired range in a low-frequency band (10Ω≤Zn≤10 kΩ, for example), the common mode self-resonating frequency Fc increases as the coupling coefficient K increases. Thus an upper limit value of the coupling coefficient K is preferably set in a range where the common mode self-resonating frequency Fc is within a high-frequency band, while taking into consideration the value of the normal mode impedance Zn, for example.

Next, operations of the power supply circuit 1 having the aforementioned configuration will be described.

When the power supply circuit 1 is driven, the DC power source 2 supplies the DC input voltage Vin to the DC-DC converter 3 through the choke coil 11. At this time, the DC-DC converter 3 steps down the DC input voltage Vin to the DC output voltage Vout in accordance with the on-off duty ratio of the transistor 5. This DC output voltage Vout is smoothed by the output-side capacitor 9 and supplied to the load 10.

With the power supply circuit 1, switching operations are carried out by the transistor 5 of the DC-DC converter 3, and thus high-frequency noise signals may enter into the positive-side power source line P, the negative-side power source line N, and so on. At this time, the noise signals may have a common mode, in which the signals propagate in the same direction in the positive-side power source line P and the negative-side power source line N, and a normal mode (differential mode), in which the signals propagate in mutually opposite directions in the positive-side power source line P and the negative-side power source line N. In other words, current flows in the same direction in the pair of coils 16A and 16B in the common mode, whereas current flows in mutually different directions in the pair of coils 16A and 16B in the normal mode.

First, the case where a common mode signal Ic (a common mode current) propagates will be described. When the common mode signal Ic propagates in the power supply circuit 1, currents flow in mutually opposite directions (opposite turning directions) in the coils 16A and 16B of the choke coil 11. Specifically, in the case where the common mode signal Ic flows from the electrode 14A toward the electrode 14B, a current Ica flows in the clockwise direction in the coil 16A. On the other hand, in the case where the common mode signal Ic flows from the electrode 15A toward the electrode 15B, a current Icb flows in the counterclockwise direction in the coil 16B. As such, according to the corkscrew law, a magnetic flux φca produced by the current Ica and a magnetic flux φcb produced by the current Icb have mutually opposite directions within the core 12. In other words, the magnetic flux φca produced by the current Ica and the magnetic flux φcb produced by the current Icb weaken each other, producing negative mutual induction between the coils 16A and 16B.

Thus in the case where the common mode signal Ic propagates in the power supply circuit 1, the currents Ica and Icb flow in mutually opposite directions in the coils 16A and 16B, and the magnetic fluxes φca and φcb weaken each other. The common mode impedance Zc of the choke coil 11 thus decreases due to the negative mutual induction.

Next, the case where a normal mode signal In (a normal mode current) propagates will be described. When the normal mode signal In propagates in the power supply circuit 1, currents flow in the same direction in the coils 16A and 16B of the choke coil 11. Specifically, in the case where the normal mode signal In flows from the electrode 14A toward the electrode 14B, a current Ina flows in the clockwise direction in the coil 16A. Additionally, in the case where the normal mode signal In flows from the electrode 15B toward the electrode 15A, a current Inb also flows in the clockwise direction in the coil 16B. As such, according to the corkscrew law, a magnetic flux φna produced by the current Ina and a magnetic flux φnb produced by the current Inb have the same direction within the core 12. In other words, the magnetic flux φna produced by the current Ina and the magnetic flux φnb produced by the current Inb strengthen each other, producing positive mutual induction between the coils 16A and 16B.

Thus in the case where the normal mode signal In propagates in the power supply circuit 1, the currents Ina and Inb flow in the same direction in the coils 16A and 16B, and the magnetic fluxes φna and φnb strengthen each other. The normal mode impedance Zn of the choke coil 11 thus becomes relatively high compared to the common mode impedance Zc due to the positive mutual induction.

Figure 4:
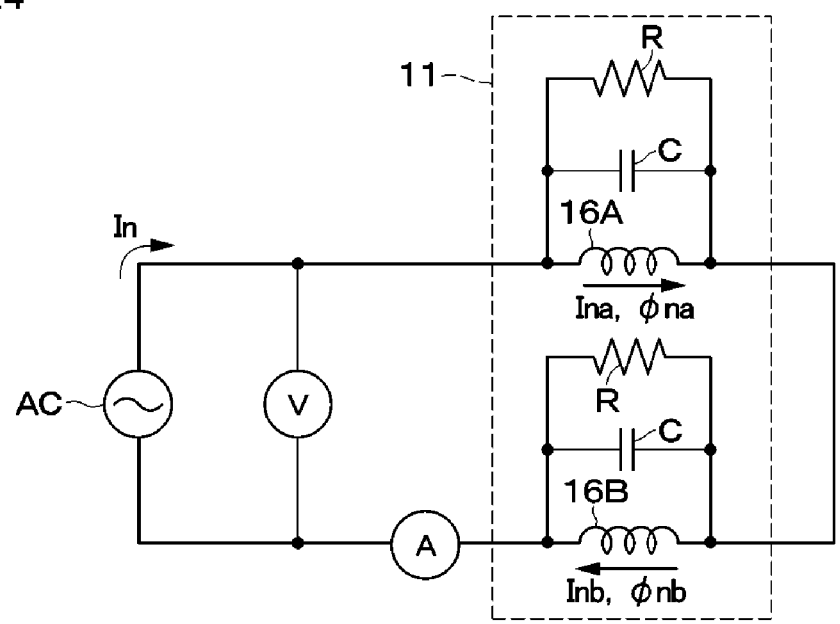
FIG. 4 is an equivalent circuit diagram illustrating a simulation model of a choke coil in a normal mode.
Figure 5:
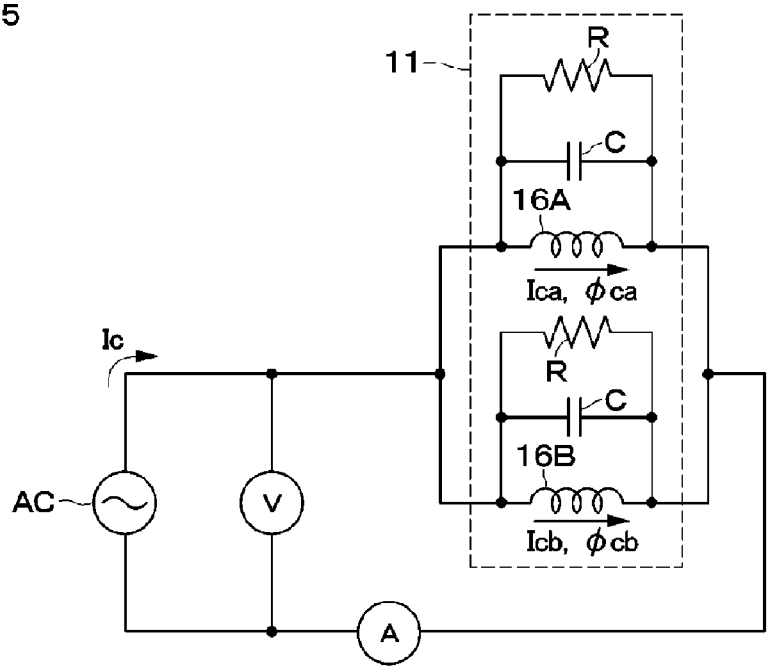
FIG. 5 is an equivalent circuit diagram illustrating a simulation model of a choke coil in a common mode.
Figure 6:
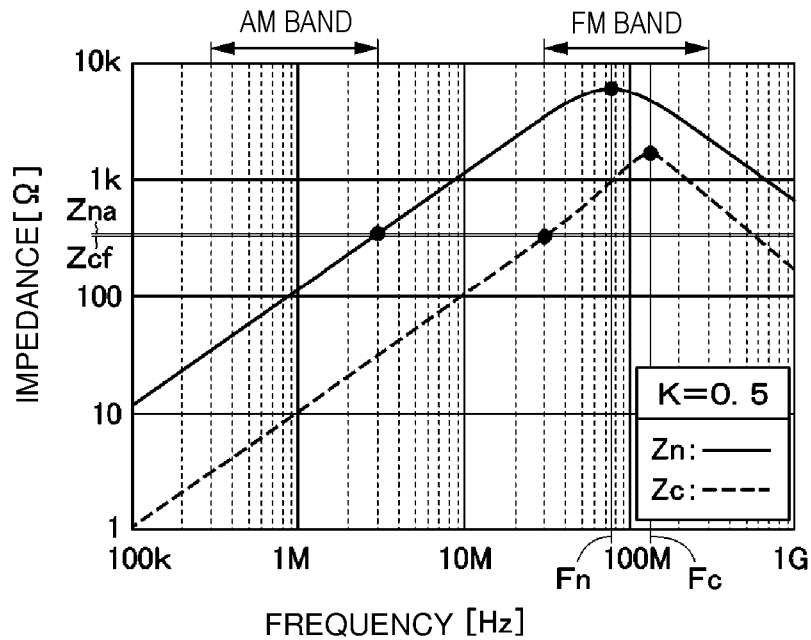
FIG. 6 is a characteristic line graph illustrating frequency characteristics of normal mode impedance and common mode impedance in a choke coil, in the case where a coupling coefficient has been set to 0.5.
Figure 7:
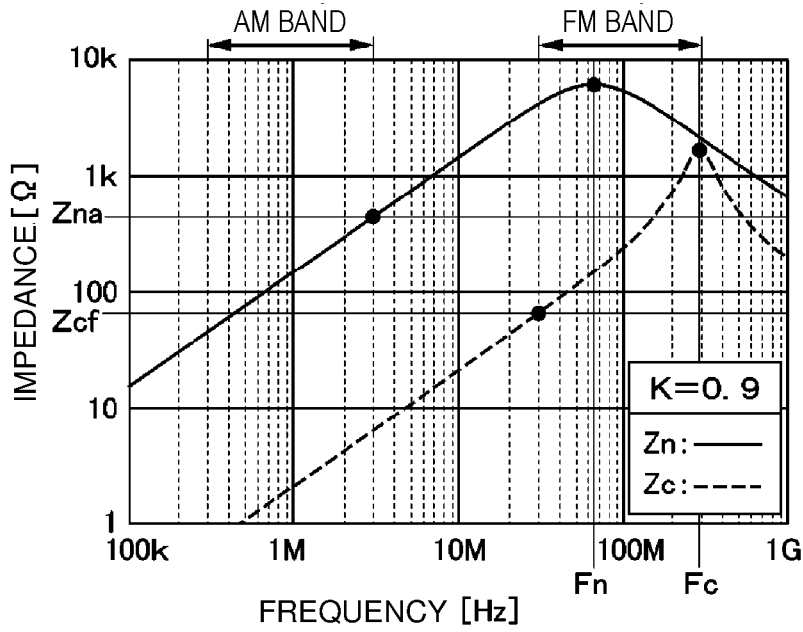
FIG. 7 is a characteristic line graph illustrating frequency characteristics of normal mode impedance and common mode impedance in the choke coil, in the case where the coupling coefficient has been set to 0.9.
Figure 8:
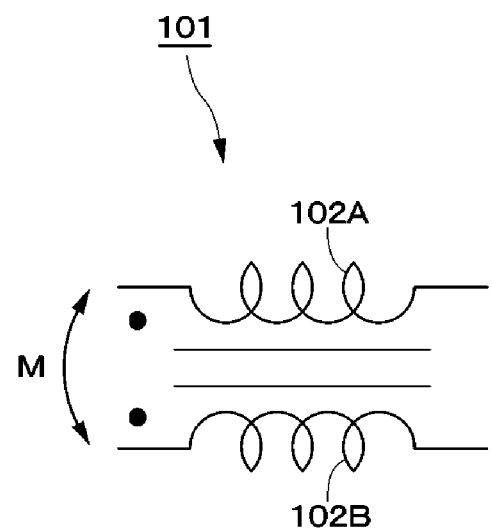
FIG. 8 is a circuit diagram illustrating a common mode choke coil according to a comparative example.
Figure 9:
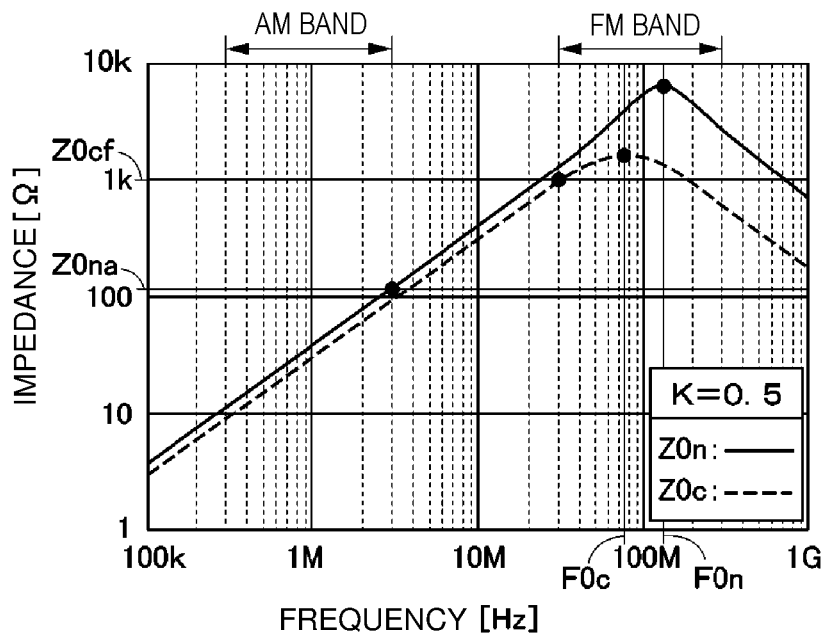
FIG. 9 is a characteristic line graph illustrating frequency characteristics of normal mode impedance and common mode impedance in the choke coil according to the comparative example, in the case where a coupling coefficient has been set to 0.5.
Figure 10:
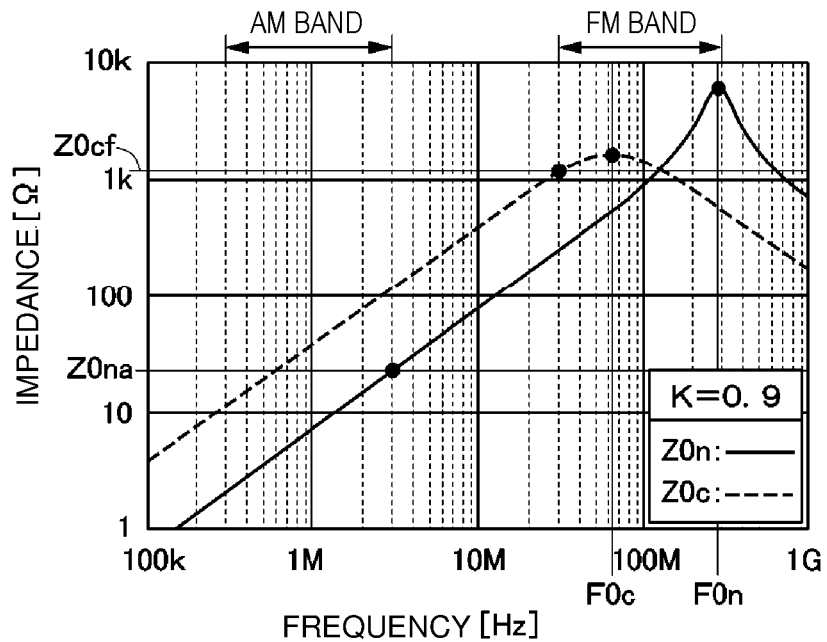
FIG. 10 is a characteristic line graph illustrating frequency characteristics of normal mode impedance and common mode impedance in the choke coil according to the comparative example, in the case where a coupling coefficient has been set to 0.9.

To confirm these effects, frequency characteristics of the common mode impedance Zc and the normal mode impedance Zn were found for the choke coil 11 according to the first embodiment through simulations. FIGS. 4 and 5 are equivalent circuit diagrams of the choke coil 11 used in the simulations, and FIGS. 6 and 7 illustrate the results obtained from these equivalent circuits. Furthermore, frequency characteristics of a common mode impedance Z0c and a normal mode impedance Z0n for a common mode choke coil 101 serving as a comparative example, illustrated in FIG. 8, were also found to compare with the results of the choke coil 11 according to the first embodiment. The results thereof are illustrated in FIGS. 9 and 10. This common mode choke coil 101 is an existing wound-type common mode choke coil in which paired coils 102A and 102B are wound in the same direction.

In the simulation models illustrated in FIGS. 4 and 5, resistances R and capacitors C are connected in parallel with the coils 16A and 16B, taking into consideration resistance components in the coils 16A and 16B, stray capacitance, and so on. When a signal at a predetermined frequency is inputted from an AC power source AC into these simulation models of the choke coil 11, a voltage on the input side of the choke coil 11 and a current flowing in the choke coil 11 will vary in accordance with the input signal. The common mode impedance Zc and the normal mode impedance Zn at this predetermined frequency are specified on the basis of this voltage and current. Accordingly, the above-described process was repeated while changing the frequency of the signal inputted from the AC power source AC as appropriate, and the frequency characteristics of the common mode impedance Zc and the normal mode impedance Zn were found.

Almost the same simulation model as that used with the choke coil 11 was also used for the common mode choke coil 101 according to the comparative example. However, while the coils 16A and 16B of the choke coil 11 are wound in mutually opposite directions, the coils 102A and 102B of the common mode choke coil 101 are wound in the same direction. Thus with the common mode choke coil 101, the common mode impedance Z0c is found using the simulation model illustrated in FIG. 4, and the normal mode impedance Z0n is found using the simulation model illustrated in FIG. 5. Note that the coils 16A, 16B, 102A, and 102B were given an inductance of 100 μH, the resistances R were given a resistance value of 5 kΩ, and the capacitors C were given a capacitance of 0.3 pF. FIGS. 6 and 9 illustrate simulation results in the case where the coupling coefficient K was set to 0.5, whereas FIGS. 7 and 10 illustrate simulation results in the case where the coupling coefficient K was set to 0.9.

In the common mode choke coil 101 according to the comparative example, the paired coils 102A and 102B are wound in the same direction. Thus negative mutual induction arises in the common mode choke coil 101 when the normal mode signal In propagates, whereas positive mutual induction arises in the common mode choke coil 101 when the common mode signal Ic propagates. Accordingly, the normal mode impedance Z0n is relatively low compared to the common mode impedance Z0c in the common mode choke coil 101.

As illustrated in FIG. 9, in the common mode choke coil 101 according to the comparative example, flux leakage arises between the pair of coils 102A and 102B when the coupling coefficient K is set to 0.5, and thus the mutual induction has less influence. Thus no major difference arises between the normal mode impedance Z0n and the common mode impedance Z0c in the AM band, which is a lower frequency band than the FM band. In this case, a normal mode impedance Z0na at the highest frequency in the AM band (3 MHz) has a lower value than a common mode impedance Z0cf at the lowest frequency in the FM band (30 MHz). Meanwhile, the common mode impedance Z0c drops in a high-frequency band such as the FM band due to the influence of magnetic saturation and the like. In this case, a self-resonating frequency F0c of the common mode impedance Z0c is near 75 MHz, and a self-resonating frequency F0n of the normal mode impedance Z0n is near 140 MHz.

On the other hand, as illustrated in FIG. 10, in the common mode choke coil 101 according to the comparative example, flux leakage decreases between the pair of coils 102A and 102B when the coupling coefficient K is set to 0.9, and thus the mutual induction has more influence. Thus although the characteristic line of the common mode impedance Z0c is similar to that obtained when the coupling coefficient K is 0.5, the characteristic line of the normal mode impedance Z0n is shifted toward the high-frequency side as compared to that obtained when the coupling coefficient K is 0.5. As a result, the self-resonating frequency F0c of the common mode impedance Z0c is near 63 MHz, and the self-resonating frequency F0n of the normal mode impedance Z0n is near 280 MHz. In the common mode choke coil 101 according to the comparative example, the normal mode impedance Z0na at the highest frequency of the AM band is a lower value than the common mode impedance Z0cf at the lowest frequency of the FM band when the coupling coefficient K is 0.9, in the same manner as when the coupling coefficient K is 0.5.

As opposed to this, in the choke coil 11 according to the first embodiment, the coils 16A and 16B are wound in mutually opposite directions. Thus positive mutual induction arises in the choke coil 11 when the normal mode signal In propagates, whereas negative mutual induction arises in the choke coil 11 when the common mode signal Ic propagates. Accordingly, the normal mode impedance Zn is relatively higher than the common mode impedance Zc in the choke coil 11.

In other words, as illustrated in FIG. 6, the normal mode impedance Zn is higher than the common mode impedance Zc in a low-frequency band such as the AM band when the coupling coefficient K is set to 0.5 in the choke coil 11. At this time, the normal mode impedance Zna at the highest frequency of the AM band is a higher value than the common mode impedance Zcf at the lowest frequency of the FM band. In this case, the self-resonating frequency Fc of the common mode impedance Zc is near 130 MHz, and the self-resonating frequency Fn of the normal mode impedance Zn is near 77 MHz. Thus the self-resonating frequency Fc of the common mode impedance Zc is higher than the self-resonating frequency Fn of the normal mode impedance Zn.

On the other hand, as illustrated in FIG. 7, in the choke coil 11, flux leakage decreases between the coils 16A and 16B when the coupling coefficient K is set to 0.9, and thus the mutual induction has more influence. Thus although the characteristic line of the normal mode impedance Zn is similar to that obtained when the coupling coefficient K is 0.5, the characteristic line of the common mode impedance Zc is shifted toward the high-frequency side as compared to that obtained when the coupling coefficient K is 0.5. In other words, the influence of flux leakage decreases as the coupling coefficient K approaches 1, and thus the common mode impedance Zc in both the AM band and the FM band decreases as a whole. At this time, the self-resonating frequency Fc of the common mode impedance Zc is near 190 MHz, and the self-resonating frequency Fn of the normal mode impedance Zn is near 65 MHz.

In the choke coil 11, the normal mode impedance Zna at the highest frequency of the AM band is a higher value than the common mode impedance Zcf at the lowest frequency of the FM band when the coupling coefficient K is 0.9, in the same manner as when the coupling coefficient K is 0.5. However, an impedance difference between the normal mode impedance Zna at the highest frequency of the AM band and the common mode impedance Zcf at the lowest frequency of the FM band (Zna−Zcf) increases as the coupling coefficient K approaches 1. In other words, the impedance difference is greater when the coupling coefficient is 0.9 than when the coupling coefficient is 0.5.

Thus according to the choke coil 11, the normal mode impedance Zn can be increased in the AM band and the common mode impedance Zc can be increased in the FM band, as compared to the common mode choke coil 101 according to the comparative example. Additionally, the characteristic line of the common mode impedance Zc can be shifted toward the high-frequency side, and the impedance difference (Zna−Zcf) can be increased, as the coupling coefficient approaches 1.

Thus according to the first embodiment, the power supply circuit 1 includes the choke coil 11. The choke coil 11 has the paired coils 16A and 16B, which are wound in mutually opposite directions, and the paired coils 16A and 16B are connected between the DC power source 2 and the DC-DC converter 3. In this case, the paired coils 16A and 16B are wound in mutually opposite directions, and thus the normal mode impedance Zn becomes higher than the common mode impedance Zc in a predetermined low-frequency band. In other words, a negative mutual inductance M arises in the choke coil 11 in the case where the common mode signal Ic propagates in the same direction in the paired coils 16A and 16B. Thus the common mode inductance of the paired coils 16A and 16B is a difference between the self-inductance L and the mutual inductance M (L−M). On the other hand, a positive mutual inductance M arises in the choke coil 11 in the case where the normal mode signal In propagates in mutually opposite directions in the pair of coils 16A and 16B. Thus the normal mode inductance of the paired coils 16A and 16B is a sum of the self-inductance L and the mutual inductance M (L+M). As such, the normal mode impedance Zn can be made higher than the common mode impedance Zc in the low-frequency band, where there is no magnetic saturation. As a result, the power supply circuit 1 can reduce normal mode noise in the low-frequency band.

Additionally, the choke coil 11 is configured such that the self-resonating frequency Fc in the common mode is higher than the self-resonating frequency Fn in the normal mode, and the normal mode impedance Zn at the highest frequency in the low-frequency band is higher than the common mode impedance Zc at the lowest frequency in the high-frequency band (Zna>Zcf). Thus the difference between the normal mode impedance Zn and the common mode impedance Zc in the low-frequency band can be increased. As a result, the power supply circuit 1 can increase the effect of reducing normal mode noise in the low-frequency band.

Additionally, the choke coil 11 is configured such that the self-resonating frequency Fc in the common mode is present within a predetermined high-frequency band. As a result, the common mode impedance Zc increases near the self-resonating frequency Fc in the common mode. The common mode impedance Zc can therefore be increased in the high-frequency band, and common mode noise arising in the high-frequency band can be reduced.

Furthermore, the configuration is such that the high-frequency band is the FM band and the low-frequency band is the AM band. Thus by being used in a vehicle-installed device, for example, the power supply circuit 1 according to the present disclosure can reduce normal mode noise in the AM band and reduce common mode noise in the FM band. As a result, normal mode noise in the AM band and common mode noise in the FM band, which is a problem in vehicle-installed devices, can be suppressed using the single choke coil 11.

The transistor 5 of the DC-DC converter 3 is driven at the switching frequency Fs, which is lower than the low-frequency band. Thus the normal mode signal In at the switching frequency flows in the pair of coils 16A and 16B upon the DC-DC converter 3 being driven. At this time, the normal mode impedance Zn at the switching frequency Fs is lower than the normal mode impedance Zn in the low-frequency band. Thus when the DC-DC converter 3 is driven, normal mode noise in the low-frequency band can be dampened while suppressing dampening of the normal mode signal In at the switching frequency Fs.

Figure 11:
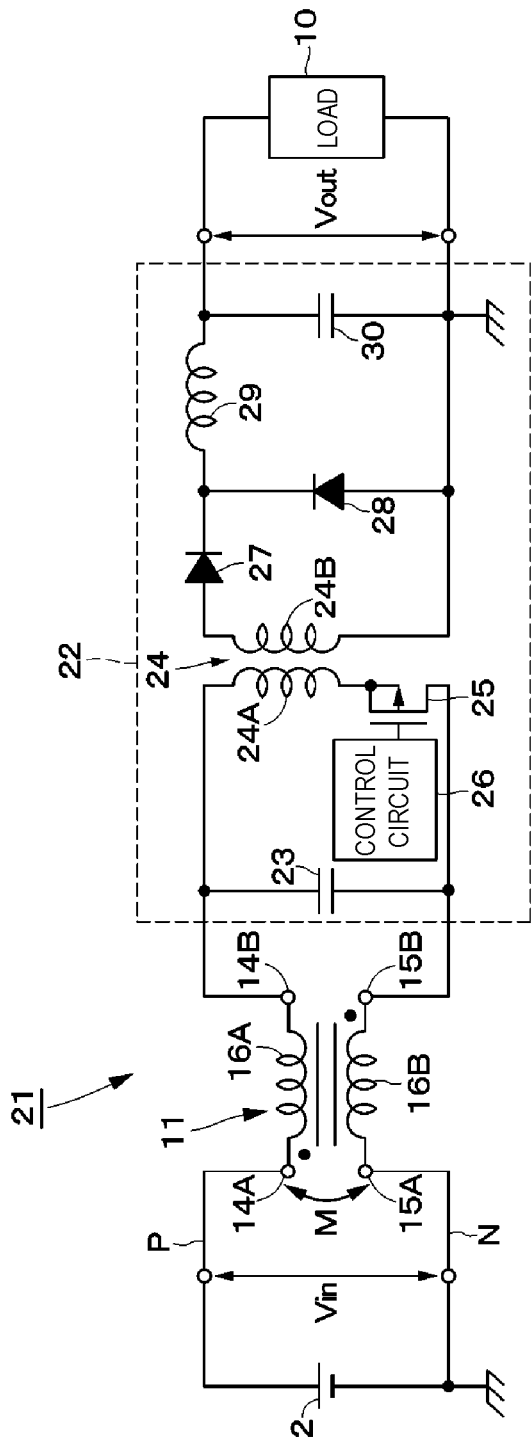
FIG. 11 is a circuit diagram illustrating the overall configuration of a power supply circuit according to a second embodiment.

A second embodiment of the present disclosure will be described next using FIG. 11. The second embodiment has a configuration in which an insulated-type DC-DC converter is used. In the second embodiment, constituent elements that are the same as in the first embodiment will be given the same reference numerals, and descriptions thereof will be omitted.

A power supply circuit 21 according to the second embodiment is constituted of a DC-DC converter 22 and the choke coil 11.

The DC-DC converter 22 is provided between the DC power source 2 and the load 10. The DC-DC converter 22 includes an input-side capacitor 23, a transformer 24, a transistor 25, a control circuit 26, a rectifying diode 27, a commutating diode 28, a coil 29, an output-side capacitor 30, and the like, and constitutes an insulated-type DC-DC converter. The DC-DC converter 22 steps down the DC input voltage Vin inputted from the DC power source 2 to the DC output voltage Vout in accordance with a duty ratio of the transistor 25.

One end of the input-side capacitor 23 is connected to the positive-side power source line P, and another end of the input-side capacitor 23 is connected to the negative-side power source line N. The input-side capacitor 4 is therefore connected to the DC power source 2 in parallel.

The transformer 24 is constituted of a primary-side coil 24A and a secondary-side coil 24B. One end of the primary-side coil 24A is connected to the coil 16A of the choke coil 11 through the positive-side power source line P, and another end of the primary-side coil 24A is connected to the source of the transistor 25. One end of the secondary-side coil 24B is connected to the anode of the rectifying diode 27, and another end of the secondary-side coil 24B is grounded.

The transistor 25 constitutes a switching element that switches the DC input voltage Vin. The transistor 25 is configured using, for example, a p-channel field-effect transistor (a p-type MOSFET) connected to the positive-side power source line P through the primary-side coil 24A. The source of the transistor 25 is connected to the primary-side coil 24A, and the drain of the transistor 25 is connected to the negative-side power source line N. The gate of the transistor 25 is connected to the control circuit 26. As such, in response to a control signal from the control circuit 26, the transistor 25 is switched between an on state, which allows the supply of current from the DC power source 2, and an off state, which stops the supply of current from the DC power source 2. At this time, the transistor 25 repeats the switching operations at a predetermined switching frequency Fs in accordance with the control signal from the control circuit 26.

The anode of the rectifying diode 27 is connected to one end of the secondary-side coil 24B, and the cathode of the rectifying diode 27 is connected to one end of the coil 29. The cathode of the commutating diode 28 is connected to one end of the coil 29, and the anode of the commutating diode 28 is grounded. The commutating diode 28 constitutes a free-wheeling diode that discharges energy stored in the coil 29. Another end of the coil 29 is connected to the load 10, and supplies the DC output voltage Vout to the load 10. The output-side capacitor 30 is connected in parallel to the load 10. The output-side capacitor 30 constitutes a smoothing capacitor.

According to the DC-DC converter 22, the on-off duty ratio of the transistor 25 is controlled by the control circuit 26, in the same manner as in the first embodiment. When the transistor 25 turns on, an electromotive force is produced in the primary-side coil 24A and the secondary-side coil 24B of the transformer 24, and a current flows toward the load 10 through the rectifying diode 27. On the other hand, when the transistor 25 turns off, an electromotive force arises in the coil 29, the stored energy is discharged, and a current flows toward the load 10 through the commutating diode 28.

Accordingly, the second embodiment can achieve almost the same actions and effects as in the first embodiment. The second embodiment has a configuration in which the insulated-type DC-DC converter 22 is used. Accordingly, using the DC-DC converter 22, the DC input voltage Vin inputted from the DC power source 2 can be stepped down to the DC output voltage Vout in accordance with the duty ratio of the transistor 25.

In the first embodiment, the switching element is constituted of the p-type MOSFET transistor 5. However, the present disclosure is not limited thereto, and various types of switching elements, such as an n-type MOSFET or a bipolar transistor, can be used as well. This applies to the second embodiment as well.

In the first embodiment, the DC-DC converter 3 is constituted of a step-down chopper circuit that steps down the DC input voltage Vin, in which the transistor 5 is connected to the DC power source 2 in series. However, the present disclosure is not limited thereto, and the DC-DC converter may be constituted of a boosting chopper circuit that boosts the DC input voltage Vin, in which a transistor is connected to a DC power source in parallel. This applies to the second embodiment as well.

In the choke coil 11 according to the foregoing embodiments, the self-resonating frequency in the common mode is present in the high-frequency band, but the present disclosure is not limited thereto. In the choke coil, the self-resonating frequency in the common mode may be present outside of the range of the high-frequency band as long as the self-resonating frequency in the common mode is in a higher range than the self-resonating frequency in the normal mode.

The foregoing embodiments describe an example in which the high-frequency band is the FM band and the low-frequency band is the AM band. However, the present disclosure is not limited thereto. The high-frequency band may be any band on the high-frequency side of the low-frequency band, and can be set as desired in accordance with the frequency bands in which normal mode noise and common mode noise arise.

In the foregoing embodiments, the transistors 5 and 25 of the DC-DC converters 3 and 22 are driven at a switching frequency that is lower than the low-frequency band. However, the present disclosure is not limited thereto. The switching element of the DC-DC converter may be driven at a switching frequency within the low-frequency band, or at a switching frequency higher than the low-frequency band.

In the foregoing embodiments, the choke coil 11 has the ferrite plate 17 attached to the core 12, and forms a closed magnetic circuit. However, the ferrite plate may be omitted. Additionally, although the choke coil 11 is described as being configured with the pair of coils 16A and 16B wound around the linear core 12, a pair of coils may instead be wound around an annular core. Furthermore, although the coils 16A and 16B are described as being formed from wires constituted of a conductive material, another material may be used as long as that material is capable of supplying the required current.

The invention claimed is:

1. A power supply circuit comprising:
   a DC-DC converter, including a switching element that switches a DC input voltage inputted from a DC power source, that supplies a DC output voltage according to an on-off duty ratio of the switching element to a load; and
   a choke coil, including a pair of coils wound in mutually opposite directions, in which the paired coils are connected between the DC power source and the DC-DC converter,
   wherein in the choke coil, a self-resonating frequency in a common mode, in which a current flows in the paired coils in the same direction, is higher than a self-resonating frequency in a normal mode, in which the current flows in the paired coils in mutually opposite directions; and
   in the choke coil, a normal mode impedance at the highest frequency in a predetermined low-frequency band is higher than a common mode impedance at the lowest frequency in a high-frequency band that is higher than the low-frequency band.

2. The power supply circuit according to claim 1, wherein the self-resonating frequency in the common mode is present within the high-frequency band.

3. The power supply circuit according to claim 1, wherein the high-frequency band is an FM band and the low-frequency band is an AM band.

4. The power supply circuit according to claim 1, wherein the switching element of the DC-DC converter is driven at a switching frequency that is lower than the low-frequency band.

* * * * *